United States Patent
Piper et al.

(10) Patent No.: US 9,877,398 B2
(45) Date of Patent: Jan. 23, 2018

(54) METHOD AND APPARATUS FOR ATTACHING A CIRCUIT COMPONENT

(71) Applicant: KELSEY-HAYES COMPANY, Livonia, MI (US)

(72) Inventors: Gerald Piper, Winona, MN (US); James Head, Holmen, WI (US); Thor Riedesel, Onalaska, WI (US)

(73) Assignee: KELSEY-HAYES COMPANY, Livonia, MI (US)

( * ) Notice: Subject to any disclaimer, the term of this patent is extended or adjusted under 35 U.S.C. 154(b) by 59 days.

(21) Appl. No.: 14/776,113

(22) PCT Filed: Mar. 31, 2014

(86) PCT No.: PCT/US2014/032338
§ 371 (c)(1),
(2) Date: Sep. 14, 2015

(87) PCT Pub. No.: WO2014/165430
PCT Pub. Date: Oct. 9, 2014

(65) Prior Publication Data
US 2016/0037652 A1    Feb. 4, 2016

Related U.S. Application Data

(60) Provisional application No. 61/808,814, filed on Apr. 5, 2013.

(51) Int. Cl.
| | | |
|---|---|---|
| H01C 10/32 | (2006.01) | |
| H05K 3/30 | (2006.01) | |
| H01C 10/46 | (2006.01) | |
| H01C 1/01 | (2006.01) | |
| H01C 10/34 | (2006.01) | |
| H05K 13/04 | (2006.01) | |

(52) U.S. Cl.
CPC ............... *H05K 3/303* (2013.01); *H01C 1/01* (2013.01); *H01C 10/34* (2013.01); *H01C 10/46* (2013.01); *H05K 13/046* (2013.01)

(58) Field of Classification Search
CPC ................................ H01C 10/34; H01C 10/46
USPC .................................................. 338/163, 162
See application file for complete search history.

(56) References Cited

U.S. PATENT DOCUMENTS

| | | |
|---|---|---|
| 6,797,907 B1 | 9/2004 | Meagher et al. |
| 7,414,205 B1 | 8/2008 | Heinrich et al. |
| 2010/0270133 A1 | 10/2010 | Baker |

OTHER PUBLICATIONS

PCT/US2014/032338 International Search Report and Written Opinion, completed Jul. 21, 2014.

*Primary Examiner* — Kyung Lee
(74) *Attorney, Agent, or Firm* — Tarolli, Sundheim, Covell & Tummino LLP

(57) ABSTRACT

Method and apparatus for attaching an electrical component to a printed circuit board. The apparatus includes a circuit board, an elastomeric connector, a rotary electrical component having a connector housing for holding the elastomeric connector, and one or more fasteners for securing the electrical component to the circuit board with sufficient force to compress the elastomeric connector and thereby ensure electrical contact between the electrical component and the printed circuit board.

13 Claims, 7 Drawing Sheets

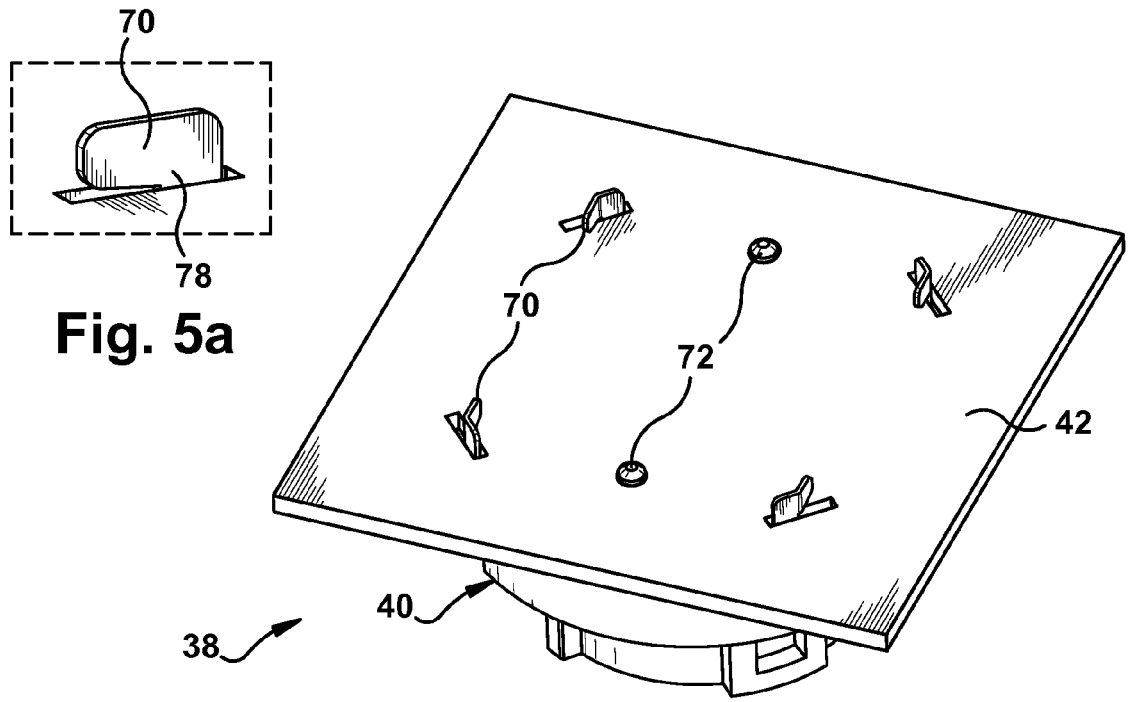
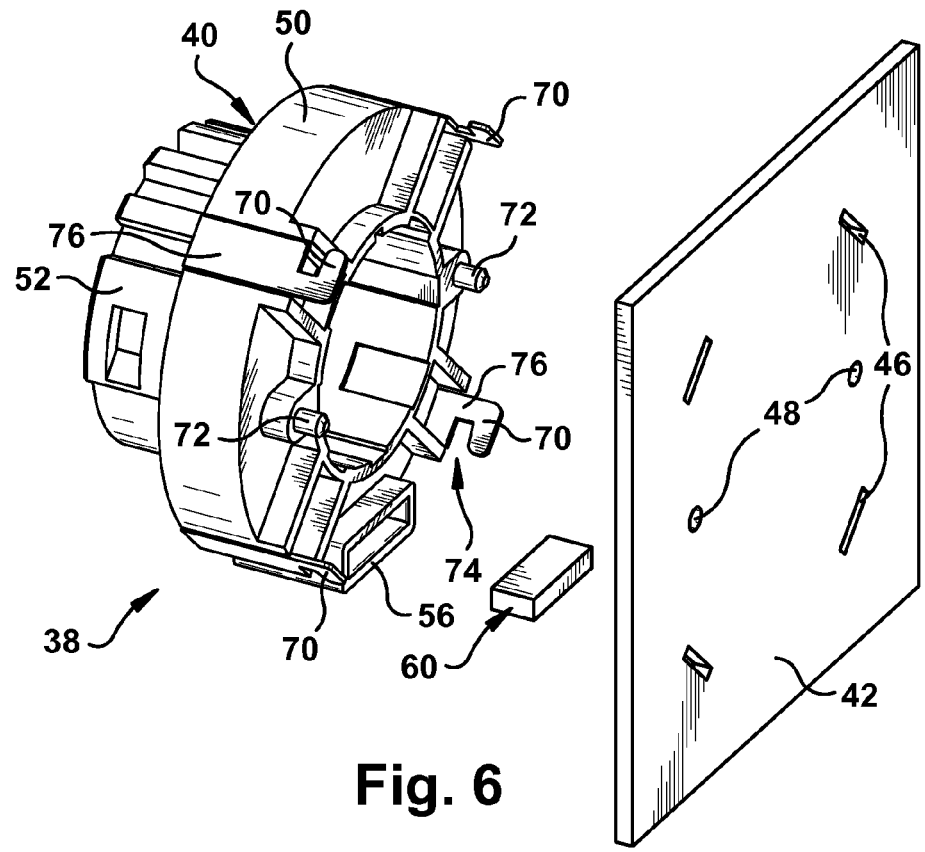

METHOD AND APPARATUS FOR ATTACHING A CIRCUIT COMPONENT

CROSS REFERENCES TO RELATED APPLICATIONS

This application filed under 35 U.S.C §371 is a national phase application of International Application Serial Number PCT/US/2014/032338 filed Mar. 31, 2014, which claims priority to U.S. Provisional Application 61/808,814, filed Apr. 5, 2013.

FIELD OF THE INVENTION

The present invention is directed to a method and apparatus for attaching a circuit component, such as a rotary potentiometer, to a printed circuit board ("PCB").

BACKGROUND

Circuit components have been attached to PCB's typically by insertion of leads of the circuit component into plated-through holes in the PCB and then soldering the component in place. In production, one technique for attachment and soldering is known as wave soldering. In large scale wave soldering, electrical components are typically mounted to associate plated-through holes in the PCB, i.e., the leads of each of the electrical components are inserted through associated plated-through holes in the PCB. Certain sections of the PCB are masked with a protective coating to prevent solder from bridging between areas that should not be electrically connected together. The populated PCB is then passed across a molten solder bed having surface waves such that the solder comes in contact with, binds to, and mechanically secures the leads of the electrical components while also electrically connecting the leads of the electrical components to the circuit traces on the PCB.

High density electronics are often attached to PCBs using surface mount technology ("SMT") instead of the older through-lead technology. Wave soldering can be used for surface mounted components, but frequently reflow soldering is instead used. Reflow soldering processes begin with the circuit components adhered to connection pads on the PCB with a solder paste. The populated PCB is then heated to melt (reflow) the solder to make the final electrical connection.

While the known soldering techniques have proven to be useful and reliable, each technique requires special equipment to accomplish the needed physical and electrical connections.

SUMMARY OF THE INVENTION

The present invention provides a method and apparatus for attaching a circuit component, such as a rotary potentiometer, to a PCB without need for soldering.

According to one example embodiment of the present invention, the apparatus includes a circuit board, an elastomeric connector, a rotary electrical component having first and second parts that are relatively rotatable and including a connector housing for holding the elastomeric connector, and at least one fastener for securing the electrical component to the circuit board with sufficient compressive force applied to the elastomeric connector to ensure electrical contact between the rotary electrical component and the circuit board.

According to another example embodiment of the present invention, the apparatus comprises a radial potentiometer. The radial potentiometer comprises a housing, a rotary dial, and a connector ring. The connector ring has a resistance side and a connection side. The resistance side includes a resistance track connectable across a power source. The connection side includes at least one electrical contact. The radial potentiometer also includes a wiper arm controlled by the rotary dial and operative for contacting the resistance track. The wiper arm is connectable to at least one of the electrical contacts for monitoring position of the wiper arm on the resistance track. The radial potentiometer also includes a circuit board for attachment to the housing and a non-soldered connector for providing electrical connection between the at least one electrical contact and the circuit board.

In accordance with yet another example embodiment of the present invention, a method is provided for attachment of a rotary electrical component to a circuit board, wherein the rotary electrical component has first and second parts that are relatively rotatable. The method comprises the steps of providing an elastomeric connector, providing a housing on the first part of the rotary electrical component, sizing the housing to receive the elastomeric connector but also to be smaller than the elastomeric connector in one dimension, whereby the elastomeric connector will protrude from the housing when the elastomeric connector is fully inserted therein but is not compressed in that one dimension, and fastening the first part of the rotary electrical component to the circuit board with sufficient force to compress the elastomeric connector in the one dimension.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 5 is a bottom view of the mounting arrangement of FIG. 3;

FIG. 6 is another exploded perspective view of the mounting arrangement of FIG. 3;

DETAILED DESCRIPTION

Figure 1:
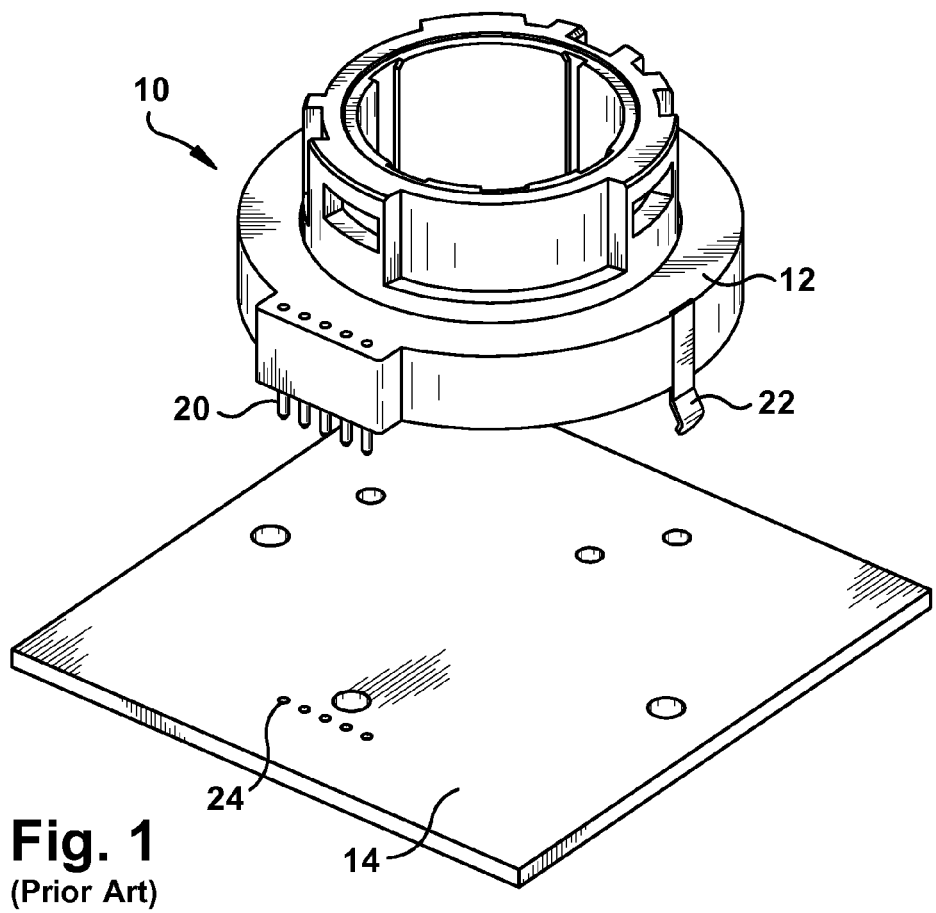
FIG. 1 is an exploded perspective view showing a known arrangement for mounting a circuit component to a PCB.
Figure 2:
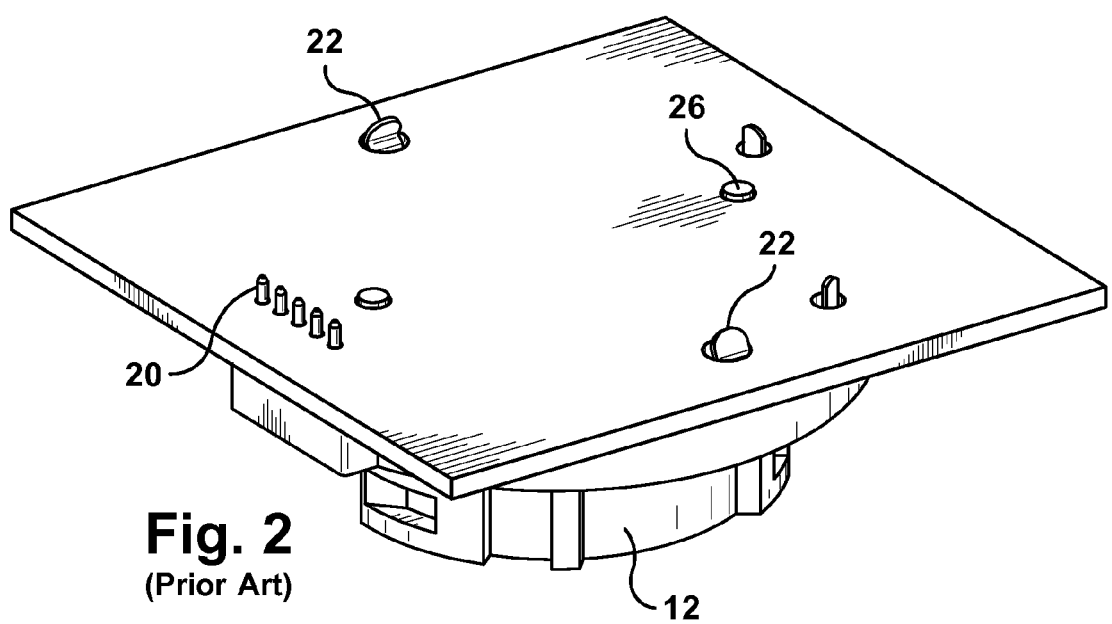
FIG. 2 is a bottom view of the known mounting arrangement of FIG. 1.
Figure 3:
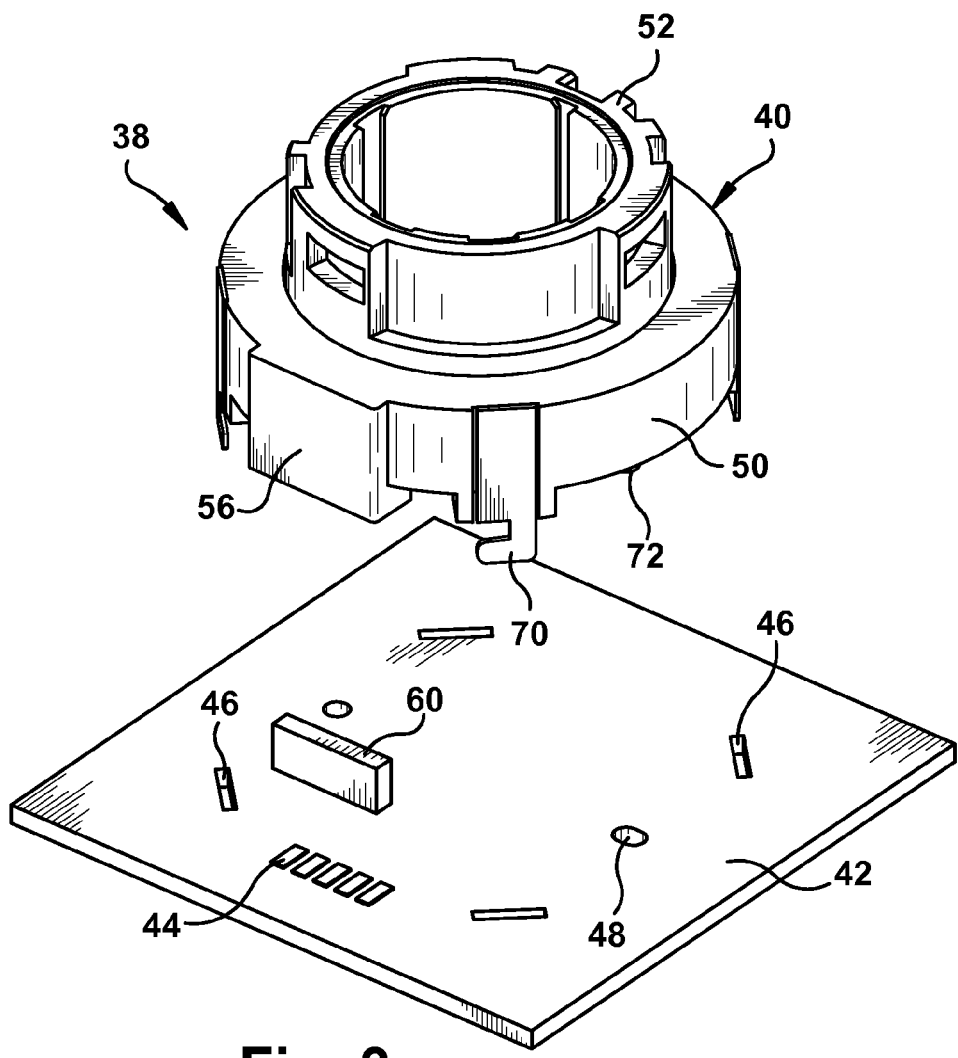
FIG. 3 is an exploded perspective view of a mounting arrangement in accordance with one example embodiment of the present invention.

Referring to FIGS. 1 and 2, a known mounting arrangement 10 between an electrical component 12 and a PCB 14 is shown. The electrical component 12 may be a rotary-type potentiometer (e.g. a temperature selection dial for a vehicle heating/ventilating/air-conditioning system) having a plurality of electrical leads or terminals 20 and alignment and securing tabs 22. PCB 14 includes a plurality of plated-through holes 24 adapted to receive the terminals 20 when the electrical component 12 is placed on the PCB 14. Two resilient alignment and securing tabs 22 snap into respective plated-through holes on PCB 14, as well, to secure electrical component 12 mechanically to PCB 14 prior to soldering. Additional alignment pins 26 (see FIG. 2) could be provided on electrical component 12, to be received through additional mounting and alignment holes in PCB 14.

Once mounted on PCB 14, the electrical component has its electrical leads 20 soldered to the plated-through holes on PCB 14 to make the final electrical and mechanical connection therebetween. The soldering operation will also solder each securing tab 22 to its respective plated-through hole. One method that could be used for the soldering process is wave soldering.

Referring to FIGS. 3 through 6, a mounting method and apparatus 38 in accordance with one example embodiment of the present invention is shown. An open center rotary electrical component 40, such as a rotary potentiometer, is shown for attachment to a PCB 42. PCB 42 has a plurality of electrical pads 44, tab receiving openings 46, and alignment holes 48. Although not shown in the drawings, PCB 42 will also have formed thereon circuit traces leading from pads 44 to other components also mounted on the PCB. Such other components and connections will provide power to the PCB and signal communication between the PCB and other elements of a larger system.

Electrical component 40 includes a base member 50 that carries a rotary dial 52, where dial 52 is rotatable relative to base member 50. Base member 50 and rotary dial 52 are both generally cylindrical in form, and both have open centers. Base member 50 includes an integrally-molded connector housing 56 having a plurality of electrical contact pads (not visible in the Figs.) located within connector housing 56. As best seen in FIG. 6, connector housing 56 encloses a hollow space and has an open bottom. The electrical contact pads in connector housing 56 are exposed in a linear array at the top of the hollow space. Connector housing 56 is adapted to receive within its hollow space an elastomeric connector 60. In the exploded drawings of FIGS. 3 and 6, Elastomeric connector 60 is shown in a direct line between connector housing 56 and pads 44.

Figure 4:
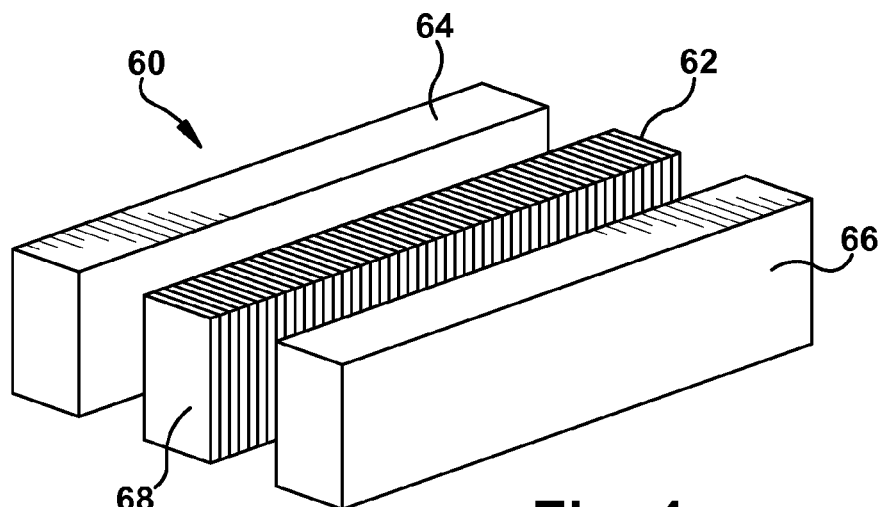
FIG. 4 is a perspective view of an elastomeric connector for use with the FIG. 3 embodiment of the present invention.

Elastomeric connector 60 is shown in exploded form in FIG. 4. Elastomeric connector 60 includes a plurality of thin, planar conductor elements 62 that are enclosed between side support barriers 64, 66. Side support barriers 64, 66 are formed of electrically insulating material. Each of the plurality of conductor elements 62 is electrically isolated from other ones of the connector elements by intervening thin, planar isolation elements 68, also formed of electrically insulating material. Conductor elements 62 and isolation elements 68 are stacked in an alternating pattern. Elastomeric connector 60 is flexible but yet conductor elements 62 are nonetheless highly conductive. In accordance with one example embodiment, conductor elements 62 are made from silver. Such elastomeric connectors are known per se and are commercially available from Fujipoly America Corp. under the trade name 'Zebra Elastomeric Connectors'.

Elastomeric connector 60 has length and width dimensions matching the internal dimensions of the hollow interior of connector housing 56. When inserted into connector housing 56, the top edges of conductor elements 62 make appropriate electrical contact with associated contact pads of electrical component 40. Conductor elements 62 are narrow and are closely spaced from one another, and therefore more than one conductor element 62 will touch each contact pad of the electrical component. Other conductor elements, however, will lie in the space separating the contact pads and thus will be electrically isolated from all of the pads. Elastomeric connector 60 has a depth somewhat greater than the depth of the hollow space within connector housing 56. Thus, before electrical component 40 is installed on PCB 42, elastomeric connector 60 protrudes by a small amount (e.g. 10-15% of its height) from the bottom of connector housing 56.

As best seen in FIGS. 5 and 6, electrical component 40 includes four metal mounting tabs 70 equally spaced around the perimeter thereof, and further includes two alignment pins 72 projecting from the bottom of base member 50. Mounting tabs 70 are received in receiving slots 46 cut through PCB 42 and alignment pins 72 are received in receiving holes 48 on PCB 42. Once electrical component 40 is inserted onto PCB 42, the free ends of tabs 70 are bent (twisted) at an angle to lock tabs 70 into the respective PCB slots, thereby holding electrical component 40 to PCB 42. When thus installed on PCB 42, elastomeric connector 60 is compressed sufficiently (e.g. 10-15% of its height) to maintain firm electrical contact between pads 44 on PCB 42 and corresponding pads of electrical component 40 via conductive elements 62 of elastomeric connector 60. Thus, when component 40 is assembled onto PCB 42, elastomeric connector 60 establishes good electrical contact between electrical component 40 and PCB 42.

Each mounting tabs 70 is defined by a deep notch 74 formed in the side of a corresponding metal strip 76 (see FIG. 6). Tabs 70 project circumferentially relative to the cylindrical outer wall of base member 50, and each tab has a notch edge 78 (corresponding to the top of notch 74) that is inclined so that the notch 74 is narrower near the root of the notch than at its open end. Notch edge 78 is best seen in inset FIG. 5a, where tab 70 is shown in its unbent configuration. The inclined notch edge 78 functions as a cam surface that pulls component 40 into tight abutment with PCB 42 when the tab is bent (twisted) at its base, defined by the root of the notch. Electrical connection is thereby established and maintained between the electrical component and the PCB without need for any soldering.

Figure 7:
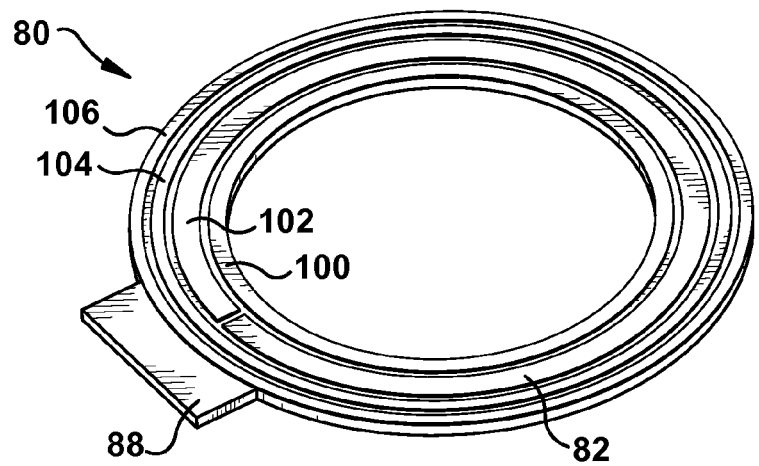
FIGS. 7-9 show elements of a rotary potentiometer in accordance with one example embodiment of the present invention.
Figure 9:
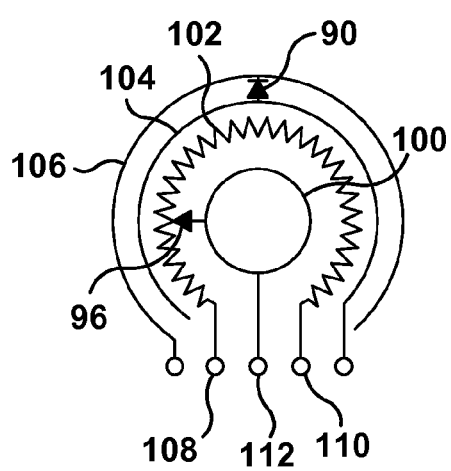
Figure 8:
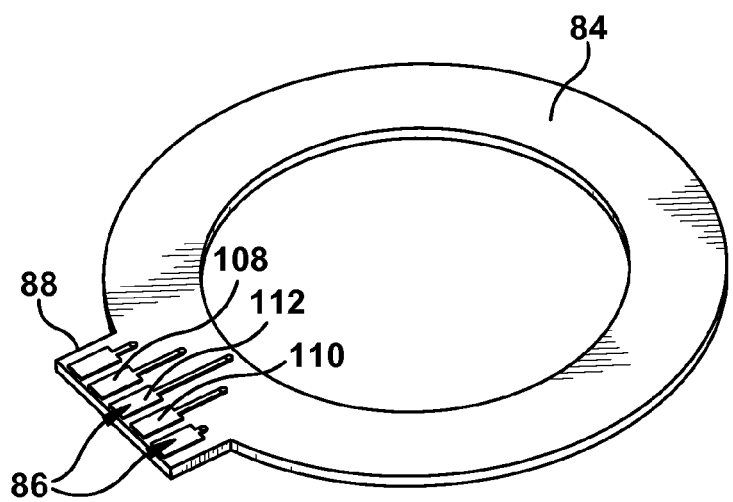

Electrical component 40 may be a rotary potentiometer. A design for interior elements of a rotary potentiometer, in accordance with an example embodiment of the present invention, is shown in FIGS. 7-9. In accordance with this example embodiment, a two-sided conductor board 80 (sometimes referred to herein as a 'connector ring') is provided having a resistor side 82 and a connector side 84. Conductor board 80 is generally a flat ring with an open center, having a tongue 88 jutting radially outward from the outer edge of the ring. In the embodiment shown, connector side 84 has five connector pads 86 formed in a linear array on tongue 88. Conductor board 80 will be assembled into, and fixed in place within, base member 50 such that resistor side 82 facing up (away from PCB 42), and tongue 88 is received through an access slot (not shown) near the top of connector housing 56. When thus mounted, the linear array of connector pads 86 are exposed at the top of connector housing 56 to elastomeric connector 60. Connector pads 86 on conductor board 80 are electrically coupled to pads 44 on PCB 42 via elastomeric connector 60 as previously described.

As shown in FIG. 7, resistor side 82 of conductor board 80 includes four concentric circular conductive tracks 100, 102, 104, and 106. The innermost track 100 and two outermost tracks 104, 106 are formed of a material having high conductivity (e.g. conventional PCB copper traces), whereby such tracks provide little electrical resistance. The second track 102, however, is formed (in a manner known per se) of a material having a predetermined resistance per inch, whereby track 102 can be and is used as the contact track for a rotary potentiometer.

The two outermost tracks 104 and 106 function, in this example embodiment, to provide power to a light emitting diode ("LED") 90 contained within rotary dial 52. Track 104 is connected to electrical power $V_{dd}$ while track 106 is connected to electrical ground. LED 90 maintains electrical contact with tracks 104 and 106 at all rotational positions of rotary dial 52 via sliding contacts (wiper arms) included in rotary dial 52. Thus, once power is applied to device 38, LED 90 will light, illuminating portions of dial 52 in any desired manner.

Resistance track 102 has two electrical terminal pads 108, 110 connected to respective circumferential ends thereof. Via the connections provided to PCB 42, terminal pad 110 may be connected to a power source $V_{cc}$ and terminal pad 108 connected to electrical ground, thereby establishing a linear voltage gradient from one end to the other of resistance track 102. Innermost track 100 is connected to electrical terminal pad 112. Rotary dial 52 includes a wiper arm (schematically indicated at 96 in FIG. 9) that bridges between respective rotational points on tracks 100 and 102, thereby connecting electrical terminal 112 to some intermediate radial position along resistor track 102 related to the rotational position of rotary dial 52. Those skilled in the art will appreciate that the voltage present on electrical terminal pad 112 will thereby vary as a function of the rotary location of wiper arm 96 and, in turn, the rotary position of rotary dial 52 of the potentiometer. This design permits a complete 360-degree rotation of the potentiometer. The potentiometer could therefore be used not only as a single turn control device but also as a multi-turn control device.

One such application could include a rotational angle sensor, either a single turn sensor or a multi-turn sensor. Within a single 360 degree rotation, angular position corresponds to, and is detected by, the voltage value measured on terminal pad 112. As a multi-turn angle sensor, circuitry (not shown) would monitor and count the number of complete rotations of the rotary dial 52 by monitoring for any abrupt transition between maximum and minimum voltage values. Final angle position within a particular turn would still be based on the voltage value at terminal pad 112.

Although conductor board 80 shown in FIGS. 7 and 8 is a two sided board with resistance and conductor tracks on one side and connector pads on the opposite side, one skilled in the art will appreciate that the connector pads could be on the same side of the board as the resistance tracks.

Figure 10:
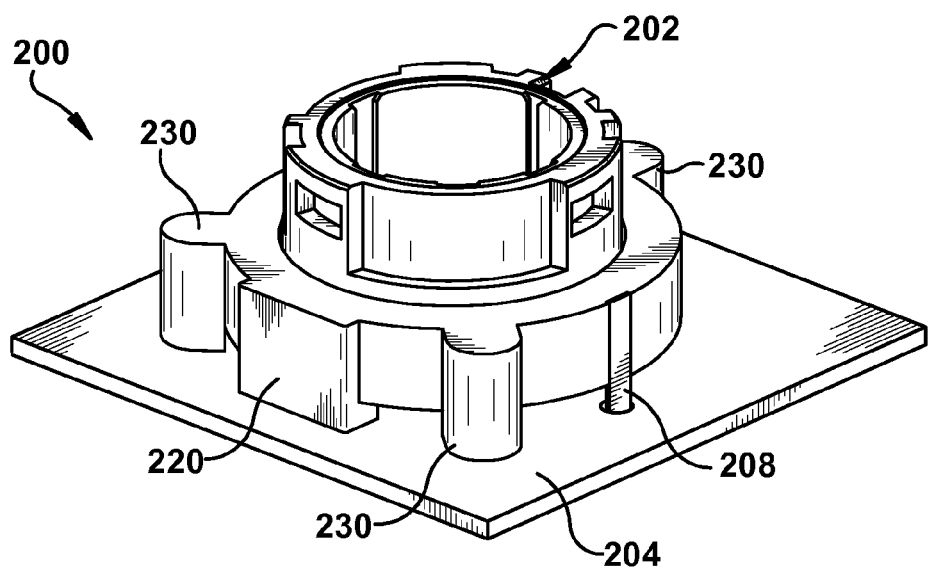
FIGS. 10 and 11 show a modified component mounting arrangement in accordance with another example embodiment of the present invention.
Figure 11:
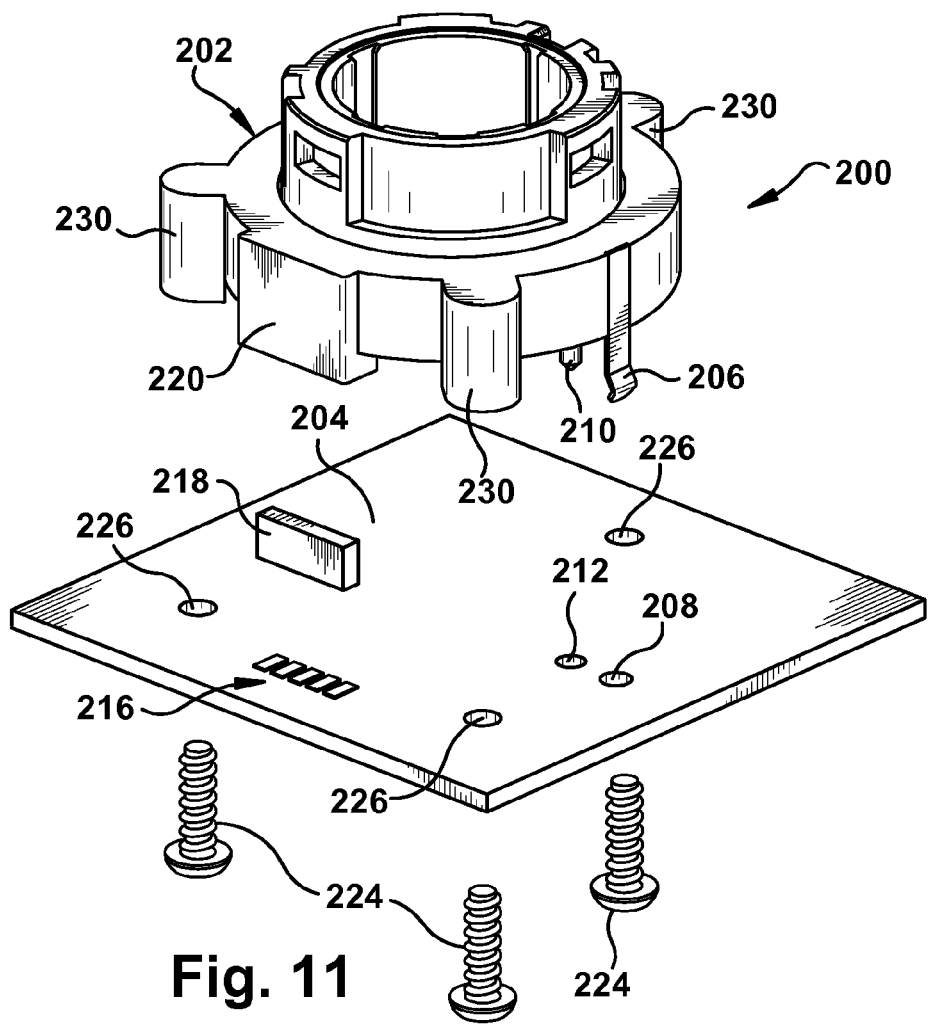

Referring to FIGS. 10 and 11, an alternative mounting arrangement 200 in accordance with another example embodiment of the present invention is shown for the mounting of an electrical component 202 to a PCB 204. In accordance with this example embodiment, electrical component 202 includes spring tabs 206 on opposing sides of component 202. Each spring tab is received in a corresponding tab-receiving hole 208 in PCB 204. Similarly, two alignment pins 210 protrude from the bottom of component 202 at diametrically opposite positions thereof and are received in corresponding alignment holes 212 on PCB 204.

In the exploded view of FIG. 11, only one set of holes 208 and 210 is visible; the view of the other set is blocked by elastomeric connector 218.

Electrical connection pads 216 are formed on PCB 204. As in the prior embodiment, an elastomeric connector 218 is received in a connector housing 220 of electrical component 202. Also as before, elastomeric connector 218 provides electrical connection between pads 216 and respective electrical connector pads (not shown) within connector housing 220.

In the example embodiment of FIGS. 10 and 11, mounting screws 224 are inserted through holes 226 in PCB 204 and are threaded into corresponding bores formed in fastener towers 230 integrally molded into the perimeter of the circuit component 202. The screws not only fasten circuit component 202 to PCB 204 but also compress elastomeric connector 218 with a predetermined amount of compressive force, e.g. compressing the connector by 10-15% of its non-compressed height.

Referring to FIGS. 12 through 15, yet another example embodiment 300 of the present invention is shown. In accordance with this embodiment, an electrical circuit component 302 is attached to a PCB 304 using four locking tabs 306 received in associated through-slots 308 in PCB 304. Alignment pins, not visible in the figures but similar to pins 72 and 210 of prior embodiments, are formed on the bottom of component 302 in registration with alignment holes 312 of PCB 304. Such pins help align component 302 on PCB 304 in the same manner as did the alignment pins of previously described embodiments.

In this embodiment, the elastomeric connector of prior embodiments is replaced by a connection system 320 including a flexible printed circuit or 'flex circuit' 322 and a zero-insertion-force ("ZIF") connector 324. Flex circuit 322 is a component part of electrical component 302. Such flex circuits are available commercially from various vendors including, for example, Multek Corporation. One end of flex circuit 322 is joined to a conductor board within component 302 and the other end of flex circuit 322 is received in ZIF connector 324. ZIF connector 324 is surface mounted on PCB 304, using conventional surface mount technology, such that connection pins protruding from the rear of ZIF connector 324 are electrically and mechanically joined to electrical pads 330 on the PCB. As stated previously with respect to other embodiments, other circuit traces, not shown, on PCB 304 connect the pads 330 to electrical power and to other electronic components of the system. A conventional flexible ribbon cable could also be used in place of the illustrated flex circuit. Moreover, although not used in the illustrated embodiment, the flex circuit could also carry processing circuitry.

Figure 12:
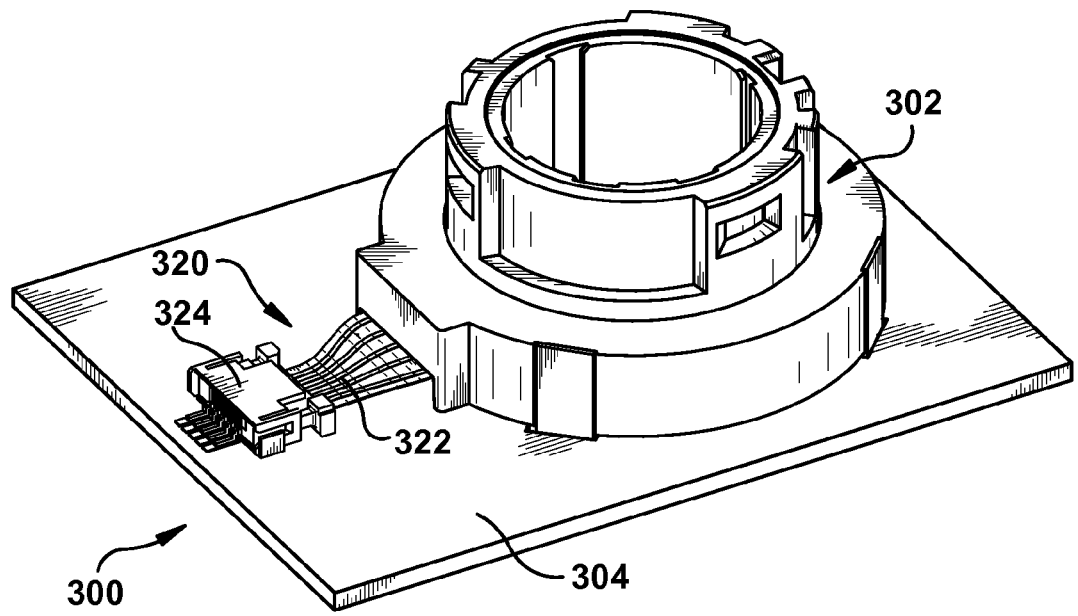
FIGS. 12 and 13 show a component mounting arrangement made in accordance with yet another example embodiment of the present invention; and, FIGS. 14 and 15 show elements of one example of a rotary potentiometer suited for use in the embodiment of FIGS. 12 and 13.
Figure 13:
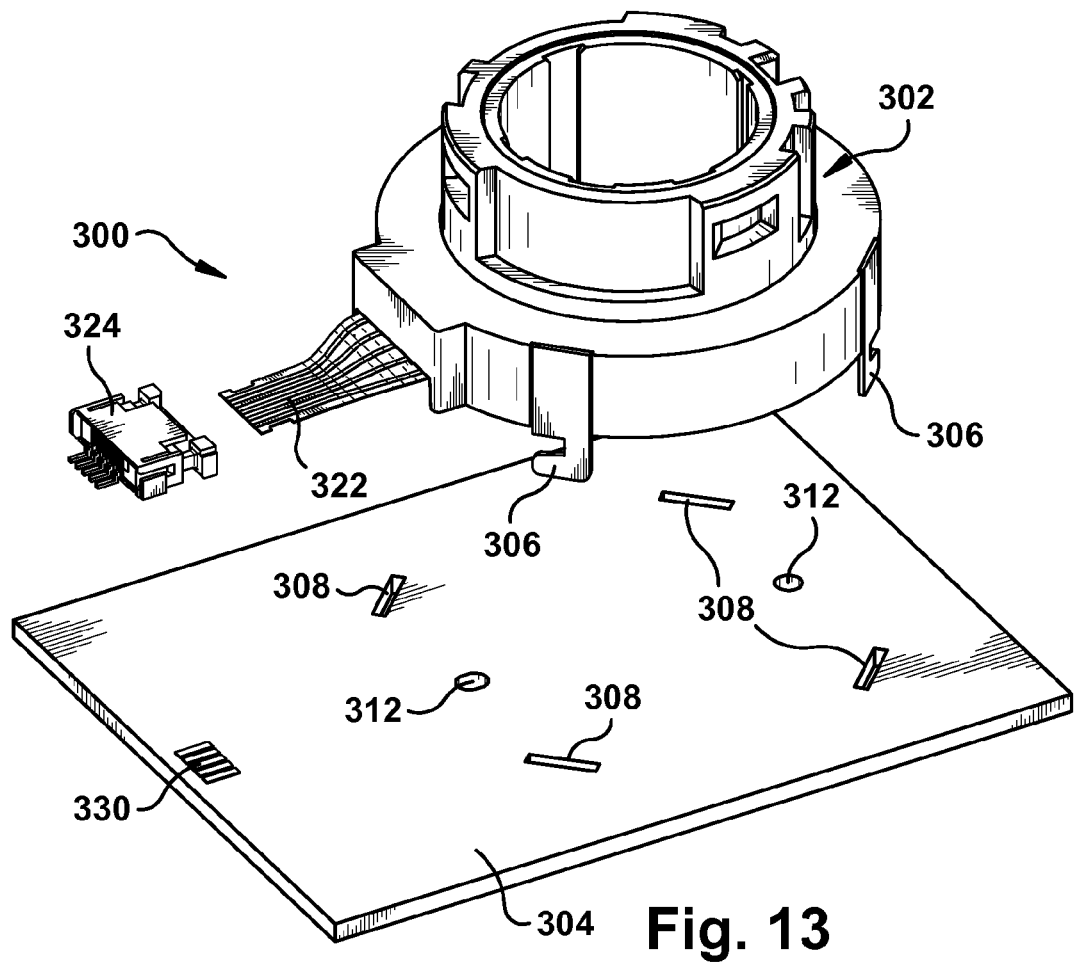
Figure 14:
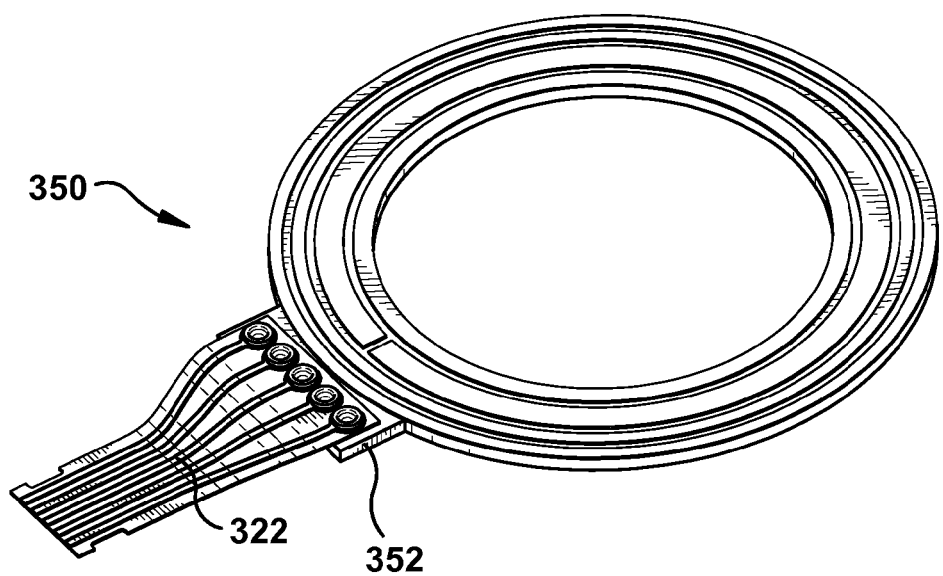
Figure 15:
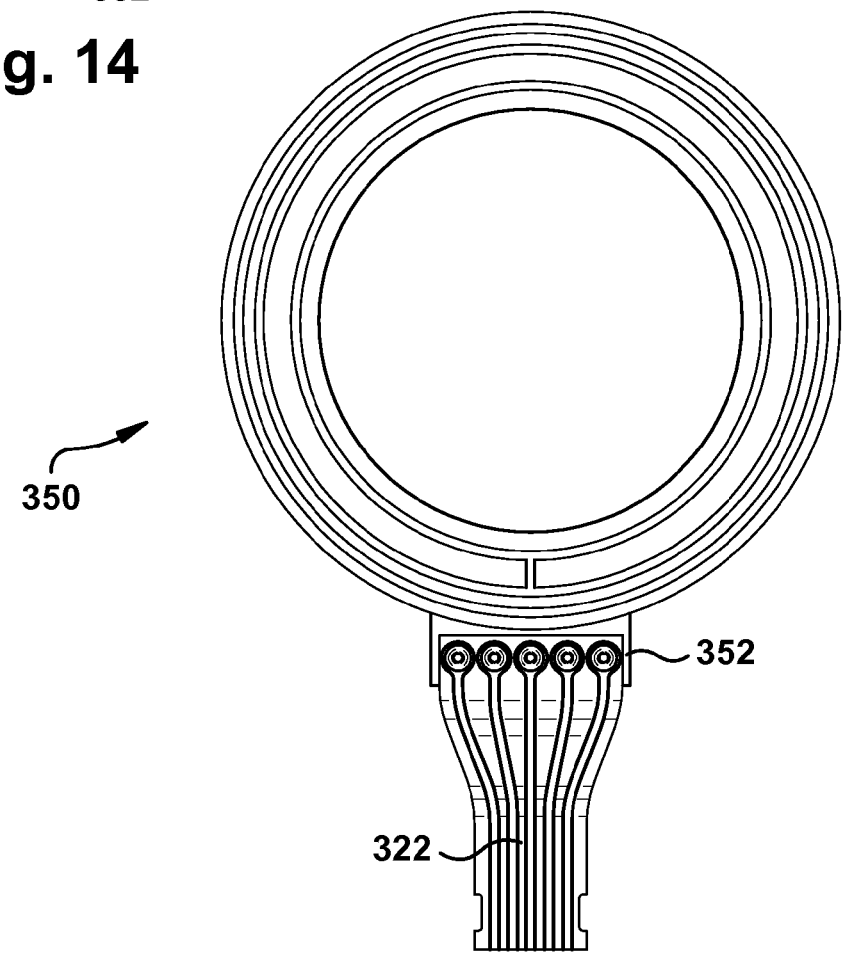

FIGS. 14-15 show a conductor board 350 designed for use in the embodiment of FIGS. 12 and 13. Conductor board 350 is generally similar to the conductor board described above with regard to FIGS. 7 through 9. Thus, conductor board 350 has a plurality of connector and resistance tracks that cooperate with, e.g., wiper arms and an LED contained within the rotary dial of electrical component 302. In this example embodiment, electrical connections to the various tracks of conductor board 350 are made through the flexible ribbon cable 322. Individual conductors of ribbon cable 322 are electromechanically fastened to respective connector pads on tongue 352, such that each conductor pad is electrically connected to a respective conductor of ribbon cable 322.

From the above description of the invention, those skilled in the art will perceive improvements, changes and modifications. Such improvements, changes, and modifications within the skill of the art are intended to be covered by the appended claims.

Having described the invention, the following is claimed:

1. Apparatus for attaching an electrical component to a circuit board comprising:
   a circuit board;
   an elastomeric connector;
   a rotary electrical component having first and second parts that are relatively rotatable and including a connector housing for holding said elastomeric connector; and
   at least one fastener for securing said electrical component to said circuit board with sufficient compressive force applied to said elastomeric connector to ensure electrical contact between said elastomeric connector and said rotary electrical component and between said elastomeric connector and said circuit board, and therefore, electrical contact between said rotary electrical component and said circuit board.

2. Apparatus as set forth in claim 1, wherein said elastomeric connector comprises a stack of thin flexible planar elements, wherein alternating ones of said planar elements are formed of insulating material and conducting material, and wherein said elastomeric connector is aligned in said connector housing such that one edge of said stack faces said circuit board.

3. Apparatus as set forth in claim 1, wherein said elastomeric connector is compressed by more than 10% in one dimension when said rotary electrical component is secured to said circuit board.

4. Apparatus as set forth in claim 1, wherein said rotary electrical component comprises a rotary potentiometer; wherein said first part is a base member and said second part is a dial member; wherein said rotary electrical component includes a resistance track and a wiper arm in movable contact with said resistance track; and further wherein the position of said wiper arm on said resistance track is related to the rotational position of said dial member relative to said base member.

5. Apparatus as set forth in claim 4, wherein said base member includes a base housing and a conductor board, wherein said base housing encloses said conductor board, and wherein said connector housing is integral with said base housing.

6. Apparatus as set forth in claim 5, wherein said elastomeric connector comprises a stack of thin compressible planar elements, wherein alternating ones of said planar elements are formed of insulating material and conducting material, wherein said elastomeric connector is aligned in said connector housing such that one edge of said stack faces said circuit board and another edge of said stack faces said conductor board, and wherein said elastomeric connector is compressed by more than 10% in at least one dimension transverse to said stack when said open center, rotary electrical component is secured to said circuit board.

7. Apparatus as set forth in claim 1, wherein said at least one fastener comprises deformable tabs.

8. Apparatus as set forth in claim 7, wherein said tabs extend behind said circuit board, wherein said tabs include cam surfaces, and wherein said tabs are deformed to cause said cam surfaces to press against the back of said circuit board and thereby apply said sufficient compressive force to said elastomeric connector.

9. Apparatus as set forth in claim 1, wherein said at least one fastener comprises at least one screw.

10. A method of attachment of a rotary electrical component to a circuit board, wherein said rotary electrical component has first and second parts that are relatively rotatable; comprising the steps of:
    providing an elastomeric connector;
    providing a housing on said first part of said rotary electrical component;
    sizing said housing to receive said elastomeric connector but also to be smaller than said elastomeric connector in one dimension, whereby said elastomeric connector will protrude from said housing when said elastomeric connector is fully inserted therein but is not compressed in said one dimension; and,
    fastening said first part of said rotary electrical component to said circuit board with sufficient force to compress said elastomeric connector in said one dimension to ensure electrical contact between said elastomeric connector and said rotary electrical component and between said elastomeric connector and said circuit board, and therefore, electrical contact between said rotary electrical component and said circuit board.

11. A method as set forth in claim 10, wherein said step of fastening comprises the step of fastening said first part of said rotary electrical component to said circuit board with sufficient force to compress said elastomeric connector by at least 10% of its extent in said one dimension.

12. A method as set forth in claim 10, wherein said step of providing said housing further comprises the step of providing an array of electrical contacts within said housing so as to be exposed to said elastomeric connector, and wherein said step of providing said elastomeric connector comprises the step of providing an elastomeric connector comprising a stack of thin compressible planar elements, wherein alternating ones of said planar elements are formed of insulating material and conducting material, and wherein the thickness of each said planar element is substantially smaller than the spacing between adjacent ones of said contacts in said array of electrical contacts.

13. A method as set forth in claim 12 and further comprising the steps of providing a resistance track in one of said first and second parts and a movable contact element in the other of said first and second parts, such that the position of said movable contact element on said resistance track will vary with the rotational position of said first and second parts; and electrically connecting at least one of said movable contact element and said resistance track with at least one contact of said array of electrical contacts.

* * * * *